United States Patent [19]

Mueller

[11] Patent Number: 5,085,975

[45] Date of Patent: Feb. 4, 1992

[54] RADIATION SENSITIVE COMPOSITION UTILIZING ETHYLENICALLY UNSATURATED PERFLUOROALKYL GROUP-CONTAINING COMPOUNDS AND REPRODUCTION LAYERS PRODUCED THEREFROM

[75] Inventor: Werner H. Mueller, E. Greenwich, R.I.

[73] Assignee: Hoechst Aktiengesellschaft, Frankfurt am Main, Fed. Rep. of Germany

[21] Appl. No.: 426,490

[22] Filed: Oct. 23, 1989

Related U.S. Application Data

[63] Continuation of Ser. No. 97,361, Sep. 8, 1987, abandoned, which is a continuation of Ser. No. 742,392, Jun. 7, 1985, abandoned.

[30] Foreign Application Priority Data

Jun. 8, 1984 [DE] Fed. Rep. of Germany ....... 3421511

[51] Int. Cl.$^5$ .................. G03F 7/027; G03F 7/029; G03F 7/032; G03F 7/32
[52] U.S. Cl. ................... 430/285; 430/270; 430/281; 430/303; 526/242; 526/245; 526/246; 526/247; 526/248; 526/249; 526/252; 560/129
[58] Field of Search ............. 430/285, 281, 270, 303; 560/129; 526/242, 245, 246, 247, 248, 249, 252

[56] References Cited

U.S. PATENT DOCUMENTS

| Re. 30,670 | 7/1981 | Ezumi et al. | 430/281 |
|---|---|---|---|
| 3,370,970 | 2/1968 | Braun | 106/287 |
| 3,511,178 | 5/1970 | Curtin | 96/27 |
| 3,677,178 | 7/1972 | Gipe | 101/450 |
| 3,682,633 | 8/1972 | Curtin | 96/27 |
| 3,894,873 | 7/1975 | Kobayashi et al. | 430/281 |
| 3,901,864 | 8/1975 | Jaeger | 260/89.5 |
| 3,910,187 | 10/1975 | Cords | 101/450 |
| 3,953,212 | 4/1976 | Miyano et al. | 96/75 |
| 4,087,584 | 5/1978 | Taniguchi et al. | 428/422 |
| 4,356,296 | 10/1982 | Griffith et al. | 526/242 |
| 4,399,211 | 8/1983 | Kondo et al. | 430/285 |
| 4,454,222 | 6/1984 | Tada et al. | 430/331 |
| 4,551,414 | 11/1985 | Asmussen et al. | 430/331 |
| 8,859,090 | 1/1975 | Yoerger et al. | 430/66 |

FOREIGN PATENT DOCUMENTS

| 37094 | 10/1981 | European Pat. Off. . |
|---|---|---|
| 40841 | 12/1981 | European Pat. Off. . |
| 96845 | 12/1983 | European Pat. Off. . |
| 1464123 | 10/1971 | United Kingdom . |
| 1501128 | 2/1978 | United Kingdom . |

*Primary Examiner*—Charles L. Bowers, Jr.
*Assistant Examiner*—Christopher G. Young
*Attorney, Agent, or Firm*—Foley & Lardner

[57] ABSTRACT

Polymerizable compounds comprising perfluoroalkyl groups, reproduction layers containing these compounds, and use of the reproduction layers for waterless offset printing. The novel polymerizable compounds comprise at least two acryloyl or methacryloyl groups and at least one perfluoroalkyl group which is linked to the molecule through a functional group, in particular, an ester or amide function. The compounds can be prepared, for example, from hydroxyl group-containing acrylates or methacrylates and perfluoroalkyl group-containing carboxylic acid chlorides, in the presence of an amine or from perfluoroalkyl group-containing carboxylic acid derivatives and reactive acryloyloxy or methacryloyloxy compounds. Oligomeric compounds can additionally be synthesized from the above-mentioned compounds by linking, for example, with diisocyanates. The compounds are particularly used in radiation-sensitive reproduction layers which also contain at least one photoinitiator and, optionally, at least one organic polymeric binder. Reproduction layers of this kind are applied as radiation-sensitive coatings to support materials for printing plates used in waterless offset printing.

5 Claims, No Drawings

RADIATION SENSITIVE COMPOSITION UTILIZING ETHYLENICALLY UNSATURATED PERFLUOROALKYL GROUP-CONTAINING COMPOUNDS AND REPRODUCTION LAYERS PRODUCED THEREFROM

This application is a continuation of application Ser. No. 07/097,361, filed Sept. 8, 1987, abandoned which is a continuation of application Ser. No. 742,392, filed June 7, 1985, abandoned.

BACKGROUND OF THE INVENTION

The present invention relates to polymerizable compounds comprising perfluoroalkyl groups and having at least two ethylenically unsaturated groups and to a process for the preparation of these compounds. The invention also relates to radiation-sensitive reproduction layers containing these compounds and to the use of these reproduction layers for waterless offset printing.

Other than in the customarily used offset-printing process, where differentiation between image areas and non-image areas during printing is effected by the simultaneous action of water or water-containing liquids, on the one hand, and printing ink, on the other hand, differentiation in waterless planographic printing, particularly offset printing, normally results from the fact that the ink-receptive, i.e., oleophilic, image areas and the ink-repellent, i.e., oleophobic, non-image areas (which are not moist with water) on a printing plate surface show different interactions with the printing ink. From the state of the art, the following publications are known, which deal with this subject:

U.S. Pat. No. 3,677,178 discloses a printing plate in which a support material comprising a metal, a plastic, or paper is coated with a layer of a hydrophobic and oleophobic silicone rubber and a radiation-sensitive reproduction layer, in the indicated or in the reverse order. As the radiation-sensitive compound, the reproduction layer contains ammonium dichromate, formaldehyde condensates of diphenylamine-4-diazonium salts, or polyvinyl cinnamate. In the printing process, the ink-receptive areas either comprise bared portions of the support material or portions of the reproduction layer which have been cured by irradiation.

In the printing plate according to U.S. Pat. No. 3,511,178 and U.S. Pat. No. 3,682,633, the support material is first coated with a radiation-sensitive reproduction layer and then with a coating having a lower release value (reduced adhesive interaction) with respect to printing inks than the support material. The last-mentioned coating either comprises a polysiloxane (silicone elastomer) or a fluorine-containing organic compound, for example, a homopolymer of the methacrylic acid ester of perfluorooctanol.

Further embodiments of printing plates for waterless offset-printing and of compounds which are suitable for use in printing plates of this kind are, for example, disclosed in the following publications:

U.S. Pat. No. 3,953,212 discloses a combination of a radiation-sensitive compound and a silicone rubber in one layer which is applied to one of the customary support materials. The printing plate according to German Auslegeschrift No. 24 22 428 (equivalent to British Pat. No. 1,464,123) contains a photopolymerizable polysiloxane and a photosensitizer in a single layer.

In German Offenlegungsschrift No. 25 24 562 (equivalent to British Patent No. 1,501,128) radiation-sensitive coatings are described, which comprise an aromatic diazonium cation, an anion of a carboxylic acid or sulfonic acid containing perfluoroalkyl groups and, optionally, a polymeric organic binder. It is stated that these layers can be used for printing directly after irradiation, i.e., a developing step is not required.

The printing plates according to U.S. Pat. No. 4,087,584 comprise, in an oleophobic coating, a fluorine-containing homopolymer or copolymer having monomer units derived from acrylic or methacrylic acid esters containing perfluoroalkyl groups, 4-perfluoroalkoxy-benzoyloxy-alkyl groups, or perfluoroalkanesulfonamido-alkyl groups. In copolymers, the proportion of the fluorine-containing monomer units exceeds 75%. This oleophobic coating is either present directly on a support material and image areas are applied to the coating, or it is present on top of an electrophotographically working reproduction layer. In the latter case, toner images are produced on the oleophobic coating.

U.S. Pat. No. 3,910,187 discloses various possibilities of producing printing plates for use in waterless offset printing by applying an intermediate or final layer to customary photopolymer printing plates (i.e., printing plates comprising a support material and a reproduction layer containing photopolymerizable compounds). These intermediate or final layers comprise perfluoroalkyl group-containing carboxylic acids, sulfonic acids, phosphonic acids and amines or polymers of perfluoroalkyl group-containing acrylic or methacrylic acid esters, maleic acid diesters, vinyl ethers, carboxylic acid vinyl esters, sulfonamido-allyl esters, and the like. The polymers are either prepared from the above-indicated monomers before application to the printing plate or are produced by photopolymerization directly on the printing plate.

According to published European Patent Application No. 0,037,094, it is possible to prepare radiation-sensitive polymers which contain copolymers of a) acrylic or methacrylic acid perfluoroalkyl esters and b) acrylic or methacrylic acid azidobenzoyloxyalkyl esters and which can be used, for example, as coatings for printing plates In addition to these copolymers, radiation-sensitive reproduction layers can also contain alkaline-developable organic binders and customary additives. After irradiation and development, a relief image is produced on the support material.

Published European Patent Application No. 0,040,841 describes radiation-sensitive polymers, comprising copolymers of a) monomers having perfluoroalkyl end groups and ethylenically unsaturated end groups and b) monomers having radiation-sensitive groups and ethylenically unsaturated groups. The monomers mentioned under a) include, for example, acrylic or methacrylic acid perfluoroalkyl esters and the monomers mentioned under b) include, for example, methacrylic acid azidobenzoyloxyalkyl esters, acrylic acid cinnamoyloxyalkyl esters, methacrylic acid benzoylphenyl esters, or methacrylic acid cinnamoylphenyl esters.

From published European Patent Application No. 0,096,845, radiation-sensitive polymers are known which comprise copolymers of a) acrylic or methacrylic acid-2-perfluoroalkoxy-2-fluoro-ethyl-1-esters or related compounds, b) monomers containing radiation-sensitive groups and ethylenically unsaturated groups, and c) optionally further fluorine-free copolymerizable vinyl monomers.

The hitherto known fluorine-containing compounds for radiation-sensitive reproduction layers which are intended for use in the field of waterless offset printing, in some cases, have an insufficient radiation sensitivity, i.e., the irradiation (exposure) times which are necessary to differentiate between image and non-image areas for the subsequent printing operation are too long. It is also a considerable disadvantage that, as a rule, organic solvents such as 2-butoxyethanol-1, ethylene glycol monoethyl ether, methylene chloride, dioxane, or hexafluoro-m-xylene must be used in the developing step. Moreover, the synthesis of the starting components is often difficult (for example, requiring several stages), so that they are not at all or only to a minor degree suitable for large-scale industrial application. Reproduction layers which do not contain a binder and/or are not subjected to an additionally differentiating developing step after the irradiation thereof, generally do not yield relatively large print runs.

SUMMARY OF THE INVENTION

It is accordingly an object of the present invention to synthesize novel radiation-sensitive compounds.

Another object of the invention is to synthesize radiation-sensitive compounds, as above, which are useful in the field of waterless offset printing.

Yet another object of the invention is to synthesize radiation-sensitive compounds, as above, which have good practical radiation sensitivity (photosensitivity).

Still another object of the invention is to synthesize radiation-sensitive compounds, as above, which can be prepared from commercially available starting materials (educts).

Yet another object of the invention is to synthesize radiation-sensitive compounds, as above, which are appropriately developable with aqueous solutions (particularly aqueous-alkaline solutions), after irradiation, when they are used in reproduction layers.

The objects of the invention are achieved by a polymerizable compound, which comprises a monomer or oligomer containing at least two ethylenically unsaturated end groups selected from acryloyl and methacryloyl, and at least one perfluoroalkyl group linked to the monomer or oligomer through a functional group.

In particular, the present invention provides a polymerizable perfluoroalkyl group-containing compound comprising a monomer or oligomer comprising at least two ethylenically unsaturated end groups selected from acryloyl and methacryloyl; at least one perfluoroalkyl group; and an intermediate moiety between the ethylenically unsaturated end groups and the perfluoroalkyl group wherein each ethylenically unsaturated end group is attached to the intermediate moiety and each perfluoroalkyl group is linked to the intermediate moiety through a functional group comprising an ester group which originally belonged to the perfluoroalkyl radical.

The objects of the invention are also achieved by a process for preparing polymerizable compounds which comprises the step of reacting a component having at least two acryloyl or methacryloyl groups and at least one hydroxyl group, with a carboxylic acid chloride containing a perfluoroalkyl group, in the presence of an amine.

The objects of the invention are further achieved by a radiation sensitive reproduction layer which comprises at least one polymerizable compound including a monomer or oligomer having at least two ethylenically unsaturated end groups selected from acryloyl and methacryloyl, and at least one perfluoroalkyl group linked to the monomer or oligomer through a functional group, and at least one photoinitiator.

DETAILED DESCRIPTION OF THE PREFERRED EMBODIMENTS

The invention provides polymerizable compounds comprising perfluoroalkyl groups and having at least two ethylenically unsaturated end groups, which are characterized in that they contain at least two acryloyl or methacryloyl groups and at least one perfluoroalkyl group which is linked to the molecule through a functional group. Within the context of the present invention, the term "linked to the molecule through a functional group" is to be understood as meaning that at least one functional group which is not directly adjacent to the acryloyl or methacryloyl group and which originally belonged to the perfluoroalkyl radical introduced into the molecule, is additionally present between the acryloyl or methacryloyl groups and the perfluoroalkyl group(s). In this connection, functional groups include groups which contain at least one heteroatom, such as O, N, P, or S. The perfluoroalkyl group(s) is-/are, in particular, linked to the molecule through an ester or amide function, the ester function being preferred. The indicated substituent groups are present on different carbon atoms of the molecules of these compounds, and the perfluoroalkyl group is, either directly or through an unbranched or branched, saturated or unsaturated alkylene intermediate member having from 1 to 5 carbon atoms, linked to the functional group, in particular to the carbon atom of the carbonyl-group moiety of the ester or amide function. It is, however, also possible to have molecules, in which the perfluoroalkyl group is linked to the O or N atom of the ester or amide function. The perfluoroalkyl groups may be unsaturated, or saturated, branched or unbranched and usually have from 4 to 20 carbon atoms, in particular from 5 to 15 carbon atoms; they preferably comprise unbranched molecular radicals and have at most two double bonds per molecular radical. If appropriate, difluoromethylene groups linked by ether bridges can also be present in the perfluoroalkyl groups.

The compounds of the present invention, which are in the form of monomers or oligomers (i.e., monomers which are linked by an at least bifunctionally reacting intermediate member, such as monomers reacted with a diisocyanate and still containing free hydroxyl groups) differ from most of the known prior art compounds, in that they have at least two acryloyl or methacryloyl groups and at least one perfluoroalkyl group in the molecule. As distinguished from the 2-(2'-perfluorohexyl-ethyl-1')-1,3-propanediol-diacrylate described in U.S. Pat. No. 3,910,187, the perfluoroalkyl group is linked to the molecular radical through a functional group—as defined above—and not exclusively through an alkylene group. In particular, the compounds of the invention include the following compounds having at least one perfluoroalkyl group:

A: Acrylic or methacrylic acid esters or partial esters of a polyhydric (at least trihydric) alcohol, having from 3 to 12 carbon atoms;

B: Addition products of compounds containing active hydrogen (e.g. of alcohols, thiols, amines, carboxylic acids, sulfonic acids, phosphonic acids, or phenols) with glycidyl acrylate or methacrylate;

C: Addition products of monoepoxy or polyepoxy compounds with acrylic or methacrylic acid;

D: Esters of N-methylol acrylamide or methacrylamide with hydroxycarboxylic acids; and E: Addition products of N-methylol acrylamide or methacrylamide with monoepoxy or polyepoxy compounds.

Of these compounds, preferred are those which possess at least three acryloyloxy or methacryloyloxy groups. The perfluoroalkyl group is, in particular, introduced into components containing at least one hydroxyl group and being, in most cases, industrially readily available, by reaction with a suitable perfluoroalkanoic acid or such an acid which additionally contains an alkylene intermediate member between the perfluoroalkyl radical and the carboxyl group or, particularly, the acid halide (preferably the acid chloride) thereof.

Specific examples of compounds of the invention are given below. It is to be understood that, in each case, the molecules carry at least one perfluoroalkyl group linked through a functional group.

The compounds mentioned under A include, for example: acrylic or methacrylic acid esters or partial esters of glycerol, trimethylol methane, trimethylol ethane, trimethylol propane, or pentaerythritol.

The compounds mentioned under B include: adducts of glycidyl acrylate or methacrylate with ethylene glycol; trimethylol methane; pentaerythritol; ethanolamine; triethanolamine; ethane dithiol; ethylene diamine; xylylene diamine; phenylene diamine; 1,6-diaminohexane; 1,12-diaminododecane; 1,3-bis-(aminomethyl)cyclohexane; 1,4-bis(aminomethyl)cyclohexane; bis(4-aminocyclohexyl)methane; malonic acid; succinic acid; glutaric acid; adipic acid; decanedioic acid; dodecanedioic acid; maleic acid; fumaric acid; itaconic acid; malic acid; tartaric acid; citric acid; phthalic acid; isophthalic acid and naphthalene dicarboxylic acid. The adducts of glycidyl acrylate or methacrylate can also be made with the following tetracarboxylic acids or the monoesters or diesters thereof: pyromellitic acid; 3,3',4,4'-diphenyltetracarboxylic acid; 1,2,5,6-naphthalenetetracarboxylic acid; 2,2', 3,3'-diphenyltetracarboxylic acid; 2,2-bis(3,4-dicarboxyphenyl)propane; 2,2-bis(2,3-dicarboxyphenyl)propane; bis(3,4-dicarboxyphenyl)sulfone, perylenetetracarboxylic acid; bis(3,4-dicarboxyphenyl)ether; 1,1-bis(2,3-dicarboxyphenyl)ethane; 1,1-bis(3,4-dicarboxyphenyl)ethane; bis(2,3-dicarboxylphenyl)methane; bis(3,4-dicarboxyphenyl)methane; 3,4,3',4'-benzophenonetetracarboxylic acid; 2,2-bis(3,4-dicarboxyphenyl)hexafluoropropane; phenol; thiophenol; hydroquinone; brenzcatechin; gallic acid; pyrogallol; bisphenol A and 2,3-bis(4-hydroxyphenyl)-hexafluoropropane.

The compounds mentioned under C include: adducts of glycidyl esters having at least two epoxy groups and from 9 to 14 carbon atoms with acrylic or methacrylic acid, for example, and adducts of acrylic and methacrylic acid with glycidyl esters of phthalic acid, tetrahydrophthalic acid, succinic acid, adipic acid, maleic acid, fumaric acid, or itaconic acid, or adducts of glycidyl ethers having at least two epoxy groups with acrylic or methacrylic acid, for example, an adduct of acrylic or methacrylic acid with the glycidyl ether of 2,2-bis(4-hydroxyphenyl)propane or 2,2-bis(4-hydroxyphenyl)-hexafluoropropane.

The compounds mentioned under D include: diesters of N-methylol acrylamide or methacrylamide with malic acid, tartaric acid or citric acid.

The compounds mentioned under E include: adducts of N-methylol acrylamide or methacrylamide on glycidyl esters of acrylic acid, methacrylic acid, phthalic acid, tetrahydrophthalic acid, maleic acid, fumaric acid, or itaconic acid.

In addition to the above-enumerated classes A to E of compounds having at least one perfluoroalkyl group, there are still other classes:

F: Addition products of isocyanatoethylacrylates or isocyanatomethylacrylates with at least trihydric alcohols or amines, which additionally must have at least one reactive OH or NH function for the introduction of the perfluoroalkyl group;

G: Perfluoroalkyl-group containing diols or polyols, dicarboxylic acids or polycarboxylic acids, diamines or polyamines, which have at least two free NH functions for converting isocyanatoethylacrylates into the corresponding urethanes, amides or ureas;

H: Perfluoroalkyl-group containing monohydric or polyhydric alcohols or mono- or polyamines, which are reacted with acrylic or methacrylic acids or the derivatives thereof, to form esters or amides; and I: Perfluoroalkyl-group and hydroxyl-group containing esters of polycarboxylic acids, which are reacted with acrylic or methacrylic acids or the derivatives thereof to form esters.

When compound classes G, H, and I are formed, there also occur structures, in which the perfluoroalkyl radical is not linked, either directly or through an alkylene intermediate member, to the carbon atom of the ester or amide groups, but is linked to the carbon atom through an O or N. These compounds are prepared in such a way that the perfluoroalkyl radical is already introduced into one of the reactants by a perfluoroalkyl alcohol, prior to the final reaction. Particular compounds of the general classes may be linked, for example, with diisocyanates to form oligomers.

Structural formulae representing the above-indicated classes A to I are, for example, the following formulae I to XII. Additional formulae are given in the experimental part of the specification:

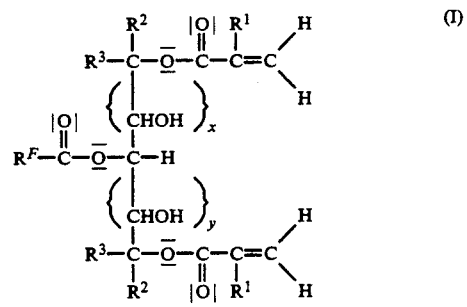

wherein $R^F$ is $F(C_wF_{2w})(-CH_2)_z$ or $F(C_{w-1}F_{2w-2})-CF=CH$, the difluoromethylene groups optionally being linked through either bridges $R^1$ is H or $CH_3$; $R^2$, $R^3$ are H, $CH_3$, or $C_2H_5$; x, y are 0, 1, or 2 z is 0 to 5; w is 5 to 15.

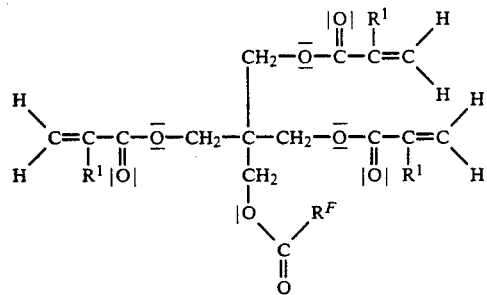
(II)
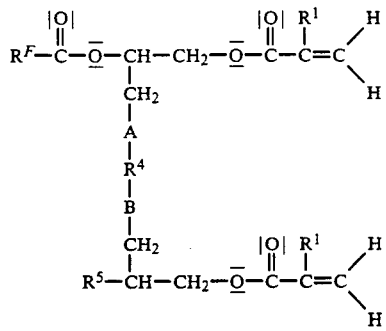
(III)
wherein A, B ore COO, CO$_2$, PO$_2$H, NH, O, or S; R$^4$ is an alkylene from C$_2$ to C$_{12}$, phenylene, naphthylene, or biphenylene (also bridged by either, thioether, or carbonyl groups); and R$^5$ is alkanoyloxy from C$_2$ to C$_{12}$, benzoyloxy, naphthoyloxy, or R$^F$—COO
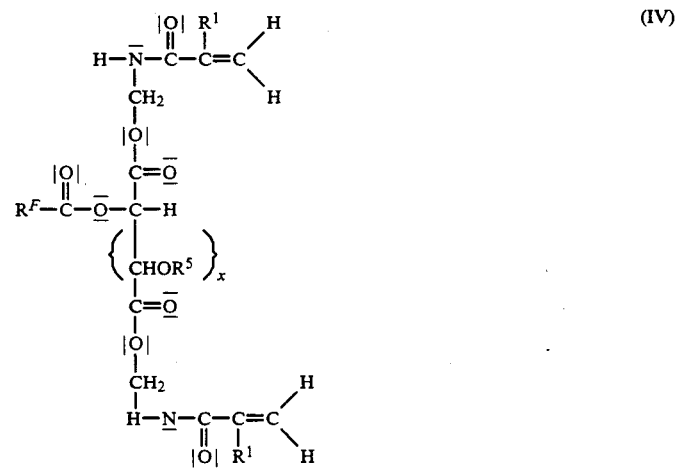
(IV)
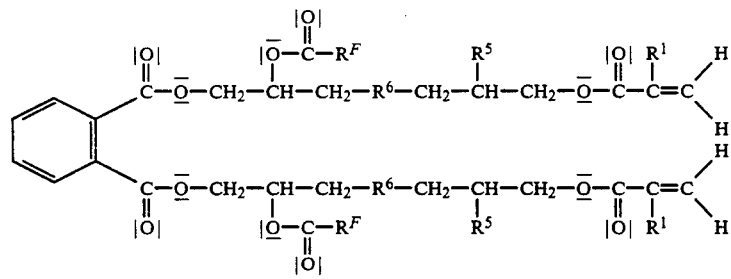
(V)
wherein R$^6$ is R$^4$, A—R$^4$—B
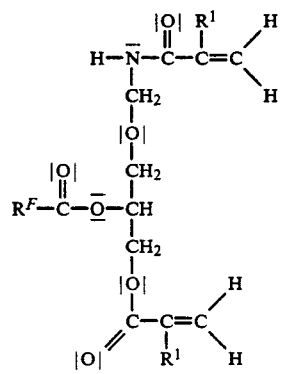
(VI)

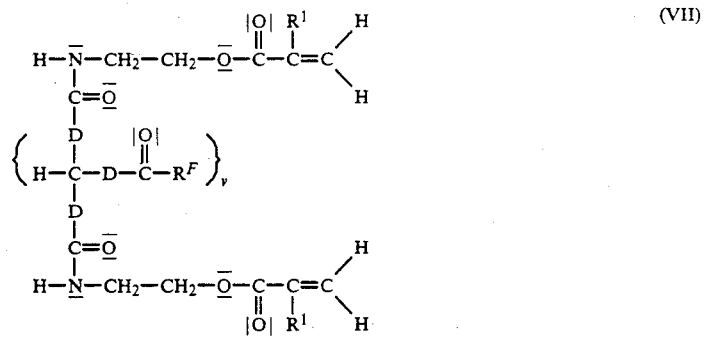
(VII)
wherein D = O, NH; v is 1 to 3
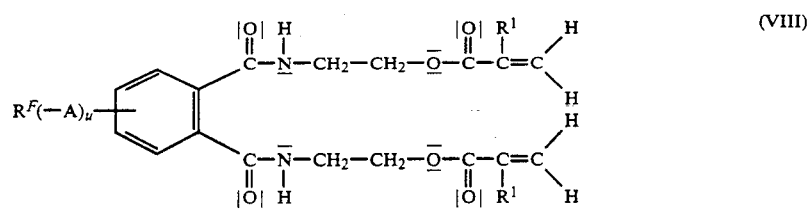
(VIII)
u is 0 or 1
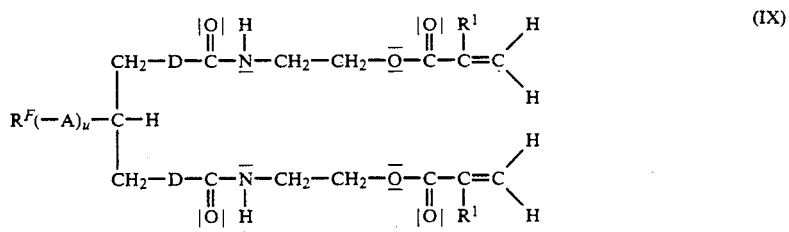
(IX)
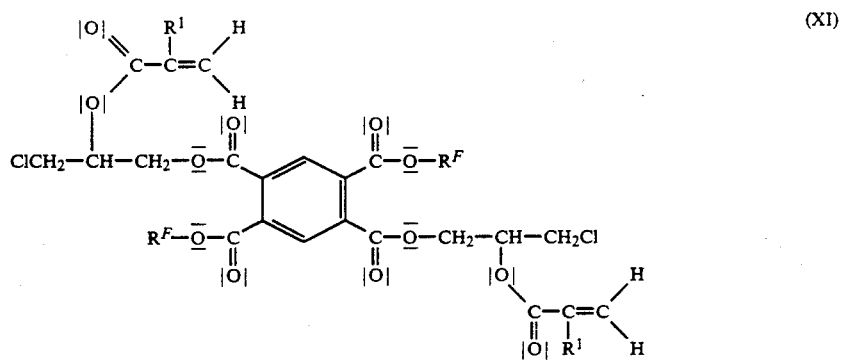
(XI)
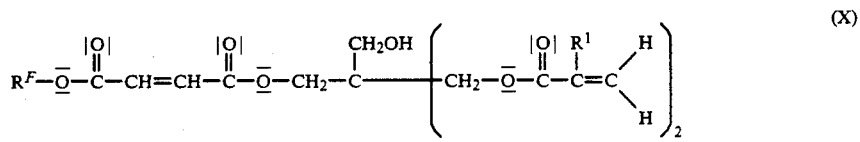
(X)

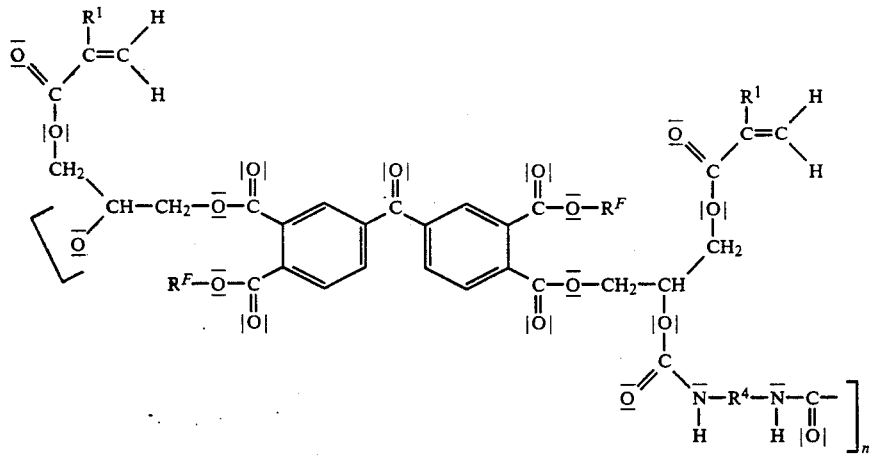

n is 2 to 5

The perfluoroalkyl group-containing acrylates and methacrylates according to the present invention are polymerizable, particularly in the presence of a photoinitiator. They can thus be used in the production of hydrophobic and oleophobic compositions, for example, varnishes, impregnating or coating agents, and especially in the production of radiation-sensitive reproduction layers. Therefore, the invention also provides radiation-sensitive reproduction layers containing a) at least one polymerizable compound comprising perfluoroalkyl groups and having at least two ethylenically unsaturated end groups and b) at least one photoinitiator, the reproduction layers being characterized in that the compound a) has at least two acryloyl groups or methacryloyl groups and at least one perfluoroalkyl group which is linked to the molecule through a functional group and the reproduction layer optionally contains c) at least one organic polymeric binder. In addition to the polymerizable compounds defined under a) above, the specified compositions, in particular, reproduction layers, can also contain further polymerizable monomers and oligomers which are free from perfluoroalkyl groups and which are optionally copolymerizable with the compounds indicated under a). In a preferred embodiment, component a) comprises a compound formed of the indicated monomers and a compound formed of the indicated oligomers.

The specified compositions usually contain from 20 to 100%, particularly from 30 to 60%, of polymerizable compounds and from 0 to 80%, particularly from 40 to 70% of organic polymeric binders (in reproduction layers, the preferred percentages are: from 20 to 80% of polymerizable compounds and from 80 to 20% of organic polymeric binders). Especially when using the compounds of the invention in reproduction layers, the binders selected also comprise organic polymers containing fluorine, preferably perfluoroalkyl groups, since this will frequently result in an improved miscibility of the components and, consequently, in a coating which is even more uniform optically The proportion of the photoinitiator in the layer generally ranges from 0.1 to 10%.

Examples of suitable binders are: polyamides, polyvinyl esters, polyvinyl acetals, polyvinyl ethers, polyacrylates, polymethacrylates, polyesters, alkyd resins, polyacrylamide, polyvinyl alcohol, polyethylene oxide, polydimethyl acrylamide, polyvinyl methylformamide, polyvinyl methylacetamide and copolymers of the monomers forming the enumerated homopolymers. Also suitable are binders comprising natural substances or converted natural substances, for example, gelatin or cellulose ethers.

It is advantageous to use binders which are soluble or at least swellable in aqueous-alkaline solutions, since layers comprising these binders can be developed with the preferred aqueous-alkaline developers. Binders of this kind, for example, can comprise the following groups: —COOH, —PO$_3$H$_2$, —SO$_3$H, —SO$_2$NH$_2$, and —SO$_2$—NH—CO—. Examples of such binders include: maleinate resins, polymers of β-methacryloyloxy-ethyl-N-(p-tolyl-sulfonyl)-carbamate and copolymers of these and similar monomers with other monomers, and also methylmethacrylate/methacrylic acid copolymers, or copolymers of methacrylic acid, alkylmethacrylates and methylmethacrylate and/or styrene, acrylonitrile etc.

The polymers comprising perfluoroalkyl groups, which are particularly preferably used in the reproduction layers of the invention, include those which have been described for the first time in copending U.S. patent application Ser. No. 742,394 entitled "Perfluoroalkyl Group-Containing Copolymers and Reproduction Layers Produced Therefrom" (corresponding to German Patent Application No. P 34 21 526) and U.S. patent application Ser. No. 742,393 entitled "Perfluoroalkyl Group-Containing Polymers and Reproduction Layers Produced Therefrom" (corresponding to German Patent Application No. P 34 21 448). These polymers are, for example, copolymers of perfluoroalkylacrylates/acrylic acid/styrene or copolymers of perfluoroalkylacrylates and acrylates having at least one phenolic OH group, or co-condensates formed of a phenolic component having perfluoroalkyl groups and a condensible compound.

As photoinitiators, a great number of substances may be used, for example, benzoin, benzoin ether; polynuclear quinones, such as 2-ethyl-anthraquinone; acridine derivatives, such as 9-phenylacridine, 9-p-methoxyphenyl-acridine, 9-acetylaminoacridine, benz(a)acridine; phenazine derivatives, such as 9,10-dimethyl-benz(a)-phenazine, 9-methyl-benz(a)phenazine, 10-methoxy-benz(a)phenazine; quinoxaline derivatives, such as 6,4',4''-trimethoxy-2,3-diphenylquinoxaline, 4',4''-dimethoxy-2,3-diphenyl-5-azaquinoxaline; quinazoline derivatives or halogenated triazine derivatives, such as 2-(4-ethoxynaphth-1-yl)-4,6-bis-trichloromethyl-s-triazine.

In addition to monomers and/or oligomers, binders, and photoinitiators, the indicated compositions, in particular the reproduction layers, can also contain a number of other customary additives, for example, inhibitors to prevent thermal polymerization of the monomers, hydrogen donors, sensitometric regulators, dyes, and colored and uncolored pigments. The sum of all components should add up to 100%. These components are appropriately selected to minimize absorption in the region of actinic radiation, which is important for the initiating process. Actinic radiation is to be understood as any radiation, the energy of which corresponds at least to that of shortwave visible light. Particularly suitable is longwave ultraviolet radiation, as well as electron emission, x-ray and laser radiation.

The indicated photopolymerizable compositions yield reproduction layers which have a high photosensitivity. In some cases, high photosensitivity exists, even if there is no covering layer as a protection against the influence of oxygen. Even without a covering layer, the reproduction layers show practically no tendency to sticking, and in the exposed state they are resistant to alkaline developers and acid alcoholic dampening solutions. The reproduction layers are conventionally prepared. The components can, for example, be taken up in a solvent and the resulting solution or dispersion is applied to the intended support as a thin film, by casting, spraying, immersion, or roller application and is subsequently dried. The reproduction layers are exposed and developed in the customary manner. Suitable developers include aqueous, preferably aqueous-alkaline, solutions, for example, solutions of alkali metal phosphates or alkali metal silicates, which are optionally admixed with minor amounts of miscible organic solvents and wetting agents.

The reproduction layers of the present invention are particularly suitable in the form of a presensitized copying material which is present on a suitable support comprising, for example, aluminum, polyester, or zinc, for use in the photomechanical production of offset-printing plates for waterless offset printing. The surface of the support material comprising, for example, aluminum can also be modified by a mechanical, chemical and/or electrochemical roughening treatment, optionally followed by an anodic oxidation.

In the preceding text and in the following examples, parts by weight and parts by volume are related as gram: $cm^3$ and percentages relate to weight, unless otherwise indicated.

EXAMPLE 1-15 AND 21

Acylation of Hydroxyacrylates 0.1 equivalent of the hydroxyacrylate (based on the content of OH groups) and 0.1 mole of the perfluoroalkyl group - containing acid chloride were dissolved in 200 parts by volume of methylene chloride. To this solution, 0.1 mole of triethylamine dissolved in 50 parts by volume of methylene chloride was added dropwise during 30 minutes, with stirring and cooling with ice. In the process, the temperature in the reaction vessel was maintained below 20° C. After postreacting for five hours at room temperature, the liquid phase was removed by filtration from the precipitated triethylammonium hydrochloride, washed chloride-free with water and dried with $MgSO_4$. After repeated filtration, 0.06 part by weight of 4-methoxyphenol was added as a polymerization inhibitor and the methylene chloride was distilled off in vacuo (for example, in a rotary evaporator). The yield was determined and then a 20% strength solution in butanone-2 was prepared from the reaction product obtained in each case, for use in the following examples of application.

In Examples 4 and 5, a technical grade mixture of pentaerythritol-triacrylate and pentaerythritoltetraacrylate was used as an educt. Since the tetraacrylate did not contain any substitutable OH group, the fluorine content in the reaction product was lower than in cases using the pure triacrylate. If the acid chloride used as a further educt contained $CH_2$ groups in addition to the $CF_2$ groups, an intramolecular take place in the reaction with the acrylate, in particular, if an excess of added amine was present. In the $^{19}F$-NMR spectrum, disappearance of a $CF_2$ signal and occurrence of a new signal of reduced intensity was then observed.

EXAMPLE 16

Reaction of Carboxylic Acids With Epoxides

In a multi-necked flask equipped with stirrer, thermometer, condenser and drying tube, 0.2 mole of glycidyl methacrylate and 0.1 mole of dicarboxylic acid were mixed by stirring and after adding 0.3 part by weight of hydroquinone as a polymerization inhibitor and 0.5 part by weight of benzyl-triethylammonium chloride, the mixture was cautiously heated to an internal temperature of about 80° C. After a treatment time of about 2 hours, a clear solution was obtained, which was diluted with butanone-2 to a solids content of 20%.

EXAMPLE 17 TO 20

Reaction With Isocyanates

In a multi-necked flask equipped with stirrer, thermometer, condenser and drying tube, 0.1 equivalent of an isocyanate or diisocyanate and 0.1 equivalent of a hydroxyl group-containing perfluoro compound in 400 parts by volume of butanone-2, were heated under nitrogen for 3 hours to 78° C., in the presence of 0.2 part by weight of dibutyl tin dilaurate. After cooling, the reaction mixture was poured into ice water and the precipitated solid was filtered off and dried. The butanone-2 solution could also be used directly in examples of application.

The educts and products of Examples 1 to 21 are characterized in detail in the following table. In the table, the products of Examples 1 to 16 and 19 to 21 are regarded as monomers and those of Examples 17 and 18 as oligomers.

TABLE I

| Examp. | Educts | Product (Structural Formula, Molecular Formula, Molecular Mass) | Yield (%) | Fluorine Content in the Product calc. | Fluorine Content in the Product found |
|---|---|---|---|---|---|
| 1 | 1.1 pentaerythritol-triacrylate (HOCH$_2$—C(CH$_2$OOCCH=CH$_2$)$_3$) <br> 1.2 2,2-dihydro-perfluoro-decanoic acid chloride F(CF$_2$)$_8$—CH$_2$—COCl | F(CF$_2$)$_7$—CF=CH—C(=O)—O—CH$_2$—C(CH$_2$—O—C(=O)—CH=CH$_2$)$_3$ <br> C$_{24}$H$_{18}$O$_8$F$_{16}$ (738) | 63 | 41.2 | 38.6 |
| 2 | 2.1 as 1.1 <br> 2.2 mixture from 2,2-dihydro-perfluoro-octanoic acid chloride to 2,2-dihydro-perfluoro-tetradecanoic acid chloride F(CF$_2$)$_{6,5}$—CH$_2$—COCl | F(CF$_2$)$_{5,5}$—CF=CH—C(=O)—O—CH$_2$—C(CH$_2$—O—C(=O)—CH=CH$_2$)$_3$ <br> C$_{22,5}$H$_{18}$O$_8$F$_{13}$ (663) | 87 | 37.3 | 36.7 |
| 3 | 3.1 as 1.1 <br> 3.2 mixture from butene(2)-dioic acid-monochloride-mono-1′,1′,2′,2′-tetra-hydroperfluoro-octylester to butene(2)-dioic acid-monochloride-mono-1′,1′,2′,2′-tetrahydroperfluoro-tetradecylester <br> F(CF$_2$)$_{7,5}$—CH$_2$—CH$_2$—O—C(=O)—CH=CH—C(=O)—Cl | F(CF$_2$)$_{7,5}$—(CH$_2$)$_2$—O—C(=O)—CH=CH—C(=O)—O—C(CH$_2$=CH—C(=O)—O—CH$_2$—)$_3$ <br> C$_{27,5}$H$_{23}$O$_{10}$F$_{16}$ (817) | 83 | 37.2 | 36.5 |
| 4 | 4.1 mixture of pentaerythritol-triacrylate and tetraacrylate <br> 4.2 2,2-dihydro-perfluoro-octanoic acid chloride F(CF$_2$)$_7$—CH$_2$—COCl | F(CF$_2$)$_5$—CF=CH—C(=O)—O—CH$_2$ <br> (CH$_2$=CH—C(=O)—O—CH$_2$—)$_3$C <br> C$_{22}$H$_{18}$O$_8$F$_{12}$ (638) | 65 | 35.7 | 21.3 |
| 5 | 5.1 as 4.1 <br> 5.2 perfluoro-octanoic acid chloride F(CF$_2$)$_7$—COCl | F(CF$_2$)$_7$—C(=O)—O—CH$_2$—C(—CH$_2$—O—C(=O)—CH=CH$_2$)$_3$ <br> C$_{22}$H$_{17}$O$_2$F$_{15}$ (634) | 77 | 41.1 | 35.5 |

TABLE I-continued

| Examp. | Educts | Product (Structural Formula, Molecular Formula, Molecular Mass) | Yield (%) | Fluorine Content in the Product calc. | found |
|---|---|---|---|---|---|
| 11 | 11.1 reaction product of bisphenol A and glycidyl methacrylate:<br><br>CH₂=CH—COO—CH₂—CH—CH₂—O—⟨phenyl⟩—C(CH₃)₂—⟨phenyl⟩—O—CH₂—CH—CH₂—OOC—CH=CH₂<br>with OH groups<br><br>11.2 as 5.2 | Structure with C₄₅H₃₄O₁₀F₃₀ (1304) | — | 43.7 | 47.9 |
| 12 | 12.1 as 11.1<br>12.2 as 1.2 | Structure with C₄₉H₃₆O₁₀F₃₂ (1392) | — | 43.7 | 47.1 |

TABLE I-continued

| Examp. | Educts | Product (Structural Formula, Molecular Formula, Molecular Mass) | Yield (%) | Fluorine Content in the Product calc. | found |
|---|---|---|---|---|---|
| 13 | 13.1 reaction product of a perfluoroalkanol, epichlorohydrin and benzenetetracarboxylic acid anhydride<br><br>ClCH$_2$—CH—CH$_2$—OOC<br>         |<br>         OH<br>F(CF$_2$)$_{7.5}$—C$_2$H$_4$—OOC<br><br>13.2 methacrylic acid chloride<br>         CH$_3$<br>         |<br>CH$_2$=C—COCl | C$_{43}$H$_{30}$O$_{12}$Cl$_2$F$_{32}$ (1417)<br><br>[structure with benzene ring bearing four ester groups: two with CH$_2$—CH(OC(O)C(CH$_3$)=CH$_2$)—CH$_2$—(CF$_2$)$_{7.5}$F and two with CH$_2$—CH(OC(O)C(CH$_3$)=CH$_2$)—CH$_2$Cl chains] | 60 | 42.9 | 43.2 |
| 14 | 14.1 reaction product of a perfluoroalkanol, epichlorohydrin and benzophenonetetracarboxylic acid anhydride<br>14.2 as 13.2 | C$_{50}$H$_{32}$O$_{13}$Cl$_2$F$_{32}$ (1519)<br><br>[benzophenone tetraester structure analogous to example 13] | 83.1 | 40.0 | 38.9 |
| 15 | 15.1 reaction product of a perfluoroalkanol, pentaerythritol and butene-2-dioic acid anhydride<br>F(CF$_2$)$_{7.5}$—C$_2$H$_4$—OOC—CH<br>                                              ‖<br>(HO—CH$_2$)$_3$C—CH$_2$—OOC—CH<br>15.2 as 13.2 | C$_{26.5}$H$_{25}$O$_9$F$_{16}$ (791)<br><br>F(CF$_2$)$_{7.5}$—CH$_2$—CH$_2$—O—C—CH<br>                                                     ‖       ‖<br>                                                     O      CH<br>         CH$_3$                                              |<br>         |                                                     C=O<br>(CH$_2$=C—C—O—CH$_2$)$_2$C—CH$_2$—O—C—CH<br>                ‖                                     |<br>                O                                     CH$_2$—O—H | 76 | 38.4 | 38.2 |

TABLE I-continued

| Examp. | Educts | Product (Structural Formula, Molecular Formula, Molecular Mass) | Yield (%) | Fluorine Content in the Product calc. | found |
|---|---|---|---|---|---|
| 16 | 16.1 reaction product of a perfluoroalkanol and benzophenonetetra-carboxyllic acid anhydride<br>16.2 methacrylic acid ester of 1,2-epoxy-propanol-3<br>$CH_2=C(CH_3)-COO-CH_2-CH(-)-CH_2$ (epoxide) | Structure with two phthalate-type groups linked via C=O bridge, bearing $F(CF_2)_{7.5}-CH_2-CH_2-O-$ and methacrylate-glycidyl ester groups<br>$C_{50}H_{34}O_{15}F_{32}$ (1482) | — | 41.0 | 36.0 |
| 17 | 17.1 product Example 16<br>17.2 hexane-1,6-diisocyanate $OCN-(CH_2)_6-NCO$ | Structure containing molecular radical product Example 16 with urethane linkages to $-(CH_2)_6-$ units, methacrylate end groups<br>$n = 2$ bis $5$<br>$C_{58}H_{46}O_{17}N_2F_{32}$ (1650) | — | 36.8 | 28.6 |

TABLE I-continued

| Examp. | Educts | Product (Structural Formula, Molecular Formula, Molecular Mass) | Yield (%) | Fluorine Content in the Product calc. | found |
|---|---|---|---|---|---|
| 18 | 18.1 product Example 16<br>18.2 toluene-1,3-diisocyanate | $C_{55}H_{40}O_{17}N_2F_{32}$ (1656) | — | 36.7 | 29.6 |
| 19 | 19.1 product Example 16<br>19.2 isocyanato-ethyl-methacrylate | $C_{64}H_{52}O_{24}N_2F_{32}$ (1792) | — | 33.9 | 28.7 |

TABLE I-continued

| Examp. | Educts | Product (Structural Formula, Molecular Formula, Molecular Mass) | Yield (%) | Fluorine Content in the Product calc. | Fluorine Content in the Product found |
|---|---|---|---|---|---|
| 20 | 20.1 as 15.1<br>20.2 as 19.2 | $F(CF_2)_{7,5}-CH_2-CH_2-O-\overset{\overset{O}{\|}}{C}-CH=CH-\overset{\overset{O}{\|}}{C}-CH(-\overset{\overset{CH_2}{\|}}{O})-CH_2-CH_2-N-\overset{O}{C}-O-CH_2)_3C$<br>$\overset{CH_3}{\|}$<br>$(CH_2=C-\overset{O}{C}-O-CH_2-CH_2-N-\overset{O}{C}-O-CH_2)_3C$<br>$\overset{\|}{O} \quad H \quad \overset{\|}{O}$<br>$C_{35.5}H_{44}O_6N_3F_{16}$ (1120) | 83 | 27.1 | 27.5 |
| 21 | 21.1 glyceroldiacrylate<br>$HOCH(-CH_2-O-\overset{\overset{O}{\|}}{C}-CH=CH_2)_2$<br>21.1 as 5.2 | $F(CF_2)_7-\overset{\overset{O}{\|}}{C}-O-CH(-CH_2-O-\overset{\overset{O}{\|}}{C}-CH=CH_2)_2$<br>$C_{17}H_{12}O_6F_{15}$ (596) | 80 | 47.8 | 43.4 |

EXAMPLES 22–47

Application

The products synthesized in Examples 1 to 21 in the form of polymerizable monomers or oligomers could be processed into reproduction layers, in admixture with a photoinitiator, a dye, and a polymeric organic binder and, optionally, a further polymerizable monomer or oligomer. For this purpose, a solution or dispersion of the components in an organic solvent (butanone-2 or 1-methoxypropanol-2) was normally prepared and coated on a support material, for example, an electrochemically roughened aluminum foil or a polyester film. Thereafter; the radiation-sensitive coating was dried. To prevent oxygen diffusion, a covering layer of polyvinyl alcohol was applied to the reproduction layer.

The offset-printing plates so prepared were exposed for 20 to 150 seconds to the light of a metal halide lamp (5kW) arranged at a distance of 100 cm from the vacuum copying frame, through a positive original. The exposed material could usually be developed with a 3% strength aqueous solution of $Na_2SiO_3$ (E1), which additionally contained glycerol, propylene glycol, and ethylene glycol monoacetate in the examples marked (E2). After rinsing with water and briefly drying at 100° C., the resulting printing plates could be used for dry printing (i.e., the damping unit of a printing machine was switched off), using commercially available special inks for waterless offset printing. The ink receptive areas were portions of the surface of the support material, while the ink repellent areas were the remaining portions of the reproduction layer.

In all examples, 2-(4-ethoxy-naphth-1-yl)-4,6-bis-trichloromethyl-s-triazine was used as the photoinitiator, and one of the perfluoroalkyl group containing polymers mentioned in the specification and described for the first time in German patent application No. P 34 21 526 was used as the binder. These polymers were copolymers comprising acrylic acid ester of $F(CF_2)_{7.5}-CH_2-CH_2-O-H$ (Component I) and methacrylic acid ester/m-hydroxybenzoic acid ester of glycerol (Component II), in the following proportions (Component I/Component II): B1 (60/40), B2 (40/60), and B3 (30/70). In the binder B4 (60/40), the first component comprised the acrylic acid ester of 1,1,2,2-tetrahydro-perfluorodecanol-1, and in the binder B5 (60/40) the first component was vinyl benzyl ether of 1,1,2,2-tetrahydroperfluorodecanol-1.

The criteria which are considered in evaluating the reproduction layer are the coating quality (G=good, S=satisfactory, M=moderate) determined by visual examination prior to irradiation, development and inking and, following these process steps, the number of clean or solid steps, respectively, in a 13-step continuous tone step wedge of a wedge constant (density gradation) of 0.15 (e.g. exposure test wedge "BK01" of KALLE Niederlassung der Hoechst AG) and the reproduction of extremely fine image elements in a 12-step, 150-dot screen halftone wedge, starting from a tonal value of 5% in step 1 and ending with a tonal value of 95% in step 12 (e.g. halftone wedge "RK01" of KALLE Niederlassung der Hoechst AG); in the application of the halftone wedge, the table indicates, on the one hand, the number of steps which still repel ink (v) (i.e., which show non-image areas) and, on the other hand, the step which is the first to accept ink (w).

TABLE II

| Components, treating agents, judgment | Parts by weight of components (and other parameters) in Example | | | | | | | | | | | | |
|---|---|---|---|---|---|---|---|---|---|---|---|---|---|
| | 22 | 23 | 24 | 25 | 26 | 27 | 28 | 29 | 30 | 31 | 32 | 33 | 34 |
| binder | | | | | | | | | | | | | |
| B1 | 1.0 | 1.0 | | | | | | | | | | | |
| B2 | | | | | 0.5 | | | | | | | | |
| B3 | | | 0.5 | 0.5 | | 1.0 | 0.5 | | | | | | |
| B4 | | | | | | | | 1.0 | 1.0 | 1.0 | 1.0 | 1.0 | 1.0 |
| B5 | | | | | | | | | | | | | |
| polymerizable monomer Ex. | | | | | | | | | | | | | |
| 1 | | | | | | | | 1.0 | | | | | |
| 2 | 0.5 | 0.5 | | | | | | | | 1.0 | | | |
| 4 | | | | | | | | | | | 1.0 | | |
| 5 | | | | | | | | | | | | 1.0 | |
| 6 | | | | | | | | | | | | | 1.0 |
| 7 | | | | | | | | | | | | | |
| 8 | | | | | | | | | | | | | |
| 9 | | | | | | | | | | | | | |
| 10 | | | | | | | | | | | | | |
| 13 | | | | 1.0 | | | | | | | | | |
| 14 | | | | | 1.0 | | | | | | | | |
| 15 | | | | | | 1.0 | | | | | | | |
| 16 | | | | | | | 1.0 | 1.0 | | | | | |
| 19 | | | | | | | | | | | | | |
| 20 | | | | | | | | | | | | | |
| 21 | | | | | | | | | | 1.0 | | | |
| polymerizable oligomer Ex. | | | | | | | | | | | | | |
| 17 | — | 0.25 | 0.5 | 0.5 | 0.5 | — | 0.5 | 0.5 | 0.5 | 0.5 | 0.5 | 0.5 | 0.5 |
| 18 | — | — | — | — | — | — | — | — | — | — | — | — | — |
| photoinitiator | 0.025 | 0.025 | 0.05 | 0.05 | 0.05 | 0.05 | 0.05 | 0.05 | 0.05 | 0.05 | 0.05 | 0.05 | 0.05 |
| dye | 0.025 | 0.025 | 0.025 | 0.025 | 0.025 | 0.025 | 0.025 | 0.02 | 0.02 | 0.02 | 0.02 | 0.02 | 0.02 |
| butanone-2 | 10 | 10 | 10 | 10 | 10 | 10 | 10 | 15 | 15 | 15 | 15 | 15 | 15 |
| 1-methoxy-propanol-2 | 4 | 4 | — | — | — | — | — | 4 | — | 4 | 4 | 4 | 4 |
| coating quality | G | G | G | G | G | G | G | G | G | G | G | S | G |

TABLE II-continued

| Components, treating agents, judgment | | | | | | | | | | | | | |
|---|---|---|---|---|---|---|---|---|---|---|---|---|---|
| exposure time (seconds) | 100 | 50 | 150 | 70 | 150 | 150 | 150 | 50 | 50 | 50 | 50 | 50 | 50 |
| developer | E1 | E1 | E2 | E1 | E1 | E1 | E2 | E1 | E2 | E1 | E1 | E1 | E1 |
| developing time (minutes) | 2 | 2 | 2 | 2 | 1 | 1 | 2 | 1.5 | 1.5 | 0.5 | 1.0 | 0.75 | 1.0 |
| cont. tone step wedge (x/y)* | 6/8 | 7/8 | 12/13 | 9/10 | 13 | 2/6 | 10/12 | 12/— | 9/11 | 5/9 | 3/5 | 4/6 | 7/10 |
| halftone step wedge (v/w) | 11/2 | 12/3 | 12/3 | 12/4 | 12/10 | 11/2 | 12/3 | 12/4 | 12/3 | 9/2 | 11/2 | 12/1 | 11/3 |

| Components, treating agents, judgment | Parts by weight of components (and other parameters) in Example | | | | | | | | | | | | |
|---|---|---|---|---|---|---|---|---|---|---|---|---|---|
| | 35 | 36 | 37 | 38 | 39 | 40 | 41 | 42 | 43 | 44 | 45 | 46 | 47 |
| binder | | | | | | | | | | | | | |
| B1 | | | | | | | | | 1.0 | 1.0 | | | |
| B2 | | | | | | | | | | | | | |
| B3 | | | | | | | | | | | | | |
| B4 | 1.0 | 1.0 | 1.0 | 1.0 | 1.0 | 1.0 | | | | | 1.0 | 1.0 | 1.0 |
| B5 | | | | | | | 1.0 | 1.0 | | | | | |
| polymerizable monomer Ex. | | | | | | | | | | | | | |
| 1 | | | | | 1.0 | 1.0 | 1.0 | 1.0 | | | | | |
| 2 | | | | | | | | | | | | | |
| 4 | | | | | | | | | | | | | |
| 5 | | | | | | | | | | 1.0 | 1.0 | | |
| 6 | | | | | | | | | | | | | |
| 7 | 1.0 | | | | | | | | | | | | |
| 8 | | 1.0 | | | | | | | | | | | |
| 9 | | | | | | | | | | | 1.0 | | |
| 10 | | | | | | | | | | | | 1.0 | |
| 13 | | | | | | | | | | | | | |
| 14 | | | | | | | | | | | | | |
| 15 | | | | | | | | | | | | | |
| 16 | | | | | | | | | | | | | |
| 19 | | | 1.0 | | | | | | | | | | |
| 20 | | | | 1.0 | | | | | | | | | |
| 21 | | | | | | | | | | | | | 1.0 |
| polymerizable oligomer Ex. | | | | | | | | | | | | | |
| 17 | 0.5 | 0.5 | 0.5 | 0.5 | 0.5 | — | 0.5 | — | 0.5 | — | — | — | — |
| 18 | — | — | — | — | — | 0.5 | — | 0.5 | — | 0.5 | — | — | — |
| photoinitiator | 0.05 | 0.05 | 0.05 | 0.05 | 0.05 | 0.05 | 0.05 | 0.05 | 0.05 | 0.05 | 0.05 | 0.05 | 0.05 |
| dye | 0.02 | 0.02 | 0.02 | 0.02 | 0.02 | 0.02 | 0.02 | 0.02 | 0.02 | 0.02 | 0.02 | 0.02 | 0.02 |
| butanone-2 | 15 | 15 | 15 | 15 | 15 | 15 | 15 | 15 | 15 | 15 | 15 | 15 | 15 |
| 1-methoxy-propanol-2 | 4 | 4 | 4 | 4 | — | — | — | — | 4 | 4 | 4 | 4 | 4 |
| coating quality | M | G | G | G | M | M | S | S | G | G | G | G | M |
| exposure time (seconds) | 50 | 50 | 50 | 50 | 20 | 20 | 20 | 20 | 50 | 50 | 50 | 50 | 50 |
| developer | E1 | E1 | E1 | E1 | E1 | E1 | E1 | E1 | E1 | E1 | E1 | E1 | E1 |
| developing time (minutes) | 1.0 | 0.5 | 1.0 | 1.0 | 1.0 | 1.0 | 1.0 | 1.0 | 0.5 | 0.5 | 0.5 | 1.25 | 1.5 |
| cont. tone step wedge (x/y)* | 6/9 | 4/7 | 10/— | 9/10 | 11/12 | 11/12 | 11/12 | 11/12 | 3/5 | 5/7 | 4/8 | 12/— | 7/13 |
| halftone step wedge (v/w) | 11/3 | 8/2 | 12/2 | 11/2 | 12/3 | 12/4 | 12/4 | 11/3 | 12/1 | 12/1 | 12/2 | 12/4 | 11/2 |

*) x = number of solid steps
y = sum of solid steps and ghost steps

The foregoing description of preferred embodiments has been set forth merely to illustrate the invention and is not intended to be limiting. Since modifications of the described embodiments incorporating the spirit and substance of the invention may occur to persons skilled in the art, the scope of the invention should be limited solely with respect to the appended claims and equivalents.

What is claimed is:

1. A radiation sensitive reproduction composition specially adapted for use in a highly photosensitive waterless offset printing plate that can be developed in aqueous-alkaline solution, comprising, in admixture:
   (a) from about 20 to about 80% by weight of the composition of a compound comprising at least one polymerizable monomer or oligomer having at least two ethylenically unsaturated end groups selected from acryloyl and methacryloyl, at least one perfluoroalkyl group, and an intermediate moiety between the ethylenically unsaturated end groups and the perfluoroalkyl group wherein each ethylenically unsaturated end group is attached to the intermediate moiety and each perfluoroalkyl group is linked to the intermediate moiety through a functional group comprising an ester group which originally belonged to the perfluoroalkyl radical;
   (b) from about 80 to about 20% by weight of the composition of an organic polymeric binder that is soluble in aqueous-alkaline solution; and
   (c) from about 0.1 to about 10% by weight of the composition of at least one photoinitiator.

2. A reproduction composition as claimed in claim 1, wherein said binder comprises perfluoroalkyl groups.

3. A reproduction composition as claimed in claim 1, further comprising at least one additional polymerizable compound free of perfluoroalkyl groups.

4. A reproduction composition as claimed in claim 1, comprising a mixture of a monomeric compound having at least two ethylenically unsaturated end groups selected from acryloyl and methacryloyl, at least one perfluoroalkyl group and an intermediate moiety between the ethylenically unsaturated end groups and the perfluoroalkyl group wherein each ethylenically unsaturated end group is attached to the intermediate moiety and each perfluoroalkyl group is linked to the intermediate moiety through a functional group comprising an ester group which originally belonged to the perfluoroalkyl radical, and an oligomer synthesized from at least two molecules of said monomeric compound by reaction with an at least bifunctionally reacting intermediate member.

5. A radiation sensitive printing plate, comprising a support member and a radiation sensitive reproduction layer on said support, wherein the reproduction layer comprises a reproduction composition as defined by claim 1.

* * * * *